(12) United States Patent
Kishimoto et al.

(10) Patent No.: US 6,473,321 B2
(45) Date of Patent: Oct. 29, 2002

(54) SEMICONDUCTOR INTEGRATED CIRCUIT AND NONVOLATILE SEMICONDUCTOR MEMORY

(75) Inventors: Jiro Kishimoto, Hamura (JP); Hiroshi Sato, Iruma (JP); Satoshi Noda, Ome (JP); Tatsuya Ishii, Koganei (JP); Shoji Kubono, Ome (JP); Takashi Ogino, Hamura (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 09/883,237

(22) Filed: Jun. 19, 2001

(65) Prior Publication Data

US 2002/0001207 A1 Jan. 3, 2002

(30) Foreign Application Priority Data

Jul. 3, 2000 (JP) ........................................ 2000-200652

(51) Int. Cl.⁷ .......................... H02M 3/18; G05F 1/10; G11C 16/02
(52) U.S. Cl. ......................... 363/59; 327/536; 365/226
(58) Field of Search .................. 363/59, 60; 327/536, 327/589, 389, 390; 365/226, 227, 189.09, 189.11

(56) References Cited

U.S. PATENT DOCUMENTS

| | | | |
|---|---|---|---|
| 5,280,420 A | | 1/1994 | Rapp |
| 5,363,335 A | * | 11/1994 | Jungroth et al. ............. 365/226 |
| 5,394,372 A | * | 2/1995 | Tanaka et al. ............... 365/226 |
| 5,491,623 A | * | 2/1996 | Jansen ......................... 363/60 |
| 5,594,380 A | * | 1/1997 | Nam ........................... 327/390 |
| 5,754,476 A | * | 5/1998 | Caser et al. ............ 365/185.29 |
| 6,008,690 A | * | 12/1999 | Takeshima et al. .......... 327/534 |
| 6,011,743 A | * | 1/2000 | Khang ......................... 365/226 |

FOREIGN PATENT DOCUMENTS

| | | |
|---|---|---|
| JP | 3-73565 | 3/1991 |
| JP | 5-28785 | 2/1993 |
| JP | 6-208798 | 7/1994 |

OTHER PUBLICATIONS

H. Morimura, "A Step–Down Boosted–Wordline Scheme for 1–V Battery–Operated Fast SRAM's", IEEE Journal of Solid–State Circuits, vol. 33, No. 8, Aug. 1998, pp. 1220–1227.

J. Shin et al., "A New Charge Pump Without Degradation in Threshold Voltage Due to Body Effect", IEEE Journal of Solid–State Circuits, vol. 35, No. 8, Aug. 2000, pp. 1227–1230.

C. Lauterbach et al., "Charge Sharing Concept and New Clocking Scheme for Power Efficiency and Electromagnetic Emission Improvement of Boosted Charge Pumps", IEEE Journal of Solid–State Circuits, vol. 35, No. 5, May 2000, pp. 719–723.

* cited by examiner

Primary Examiner—Rajnikant B. Patel
(74) Attorney, Agent, or Firm—Miles & Stockbridge P.C.

(57) ABSTRACT

For a semiconductor integrated circuit having an internal booster circuit such as a flash memory, voltage booster circuits capable of generating a boosted voltage 10 times or more as high as a relatively low source voltage is to be realized. Charge pumps for carrying out first stage voltage boosting on the basis of a source voltage are configured of parallel capacity type units, and charge pumps for carrying out second stage voltage boosting on the basis of the boosted voltage generated by the first charge pumps are configured of serial capacity type units.

23 Claims, 10 Drawing Sheets

SEMICONDUCTOR INTEGRATED CIRCUIT AND NONVOLATILE SEMICONDUCTOR MEMORY

BACKGROUND OF THE INVENTION

The present invention relates to a technique which can be especially effective when applied to an internal booster circuit in a semiconductor integrated circuit, and more particularly to a technique which can be effectively applied to, for instance an internal booster circuit in a nonvolatile memory in which stored information can be electrically erased.

A flash memory uses as its memory cell a nonvolatile memory element consisting of a MOSFET of a double gate structure having a control gate and a floating gate, wherein the threshold voltage of the MOSFET can be varied and information can be stored by altering the fixed electric charge of the floating gate. In such a flash memory, writing or erasing any content into or out of memory cells requires a high voltage (e.g. ±10 V or more) to vary the threshold voltage by withdrawing (or ejecting) or injecting an electric charge out of or into the floating gate of the nonvolatile memory element. It is usual in a flash memory to generate such a high voltage from an internal booster circuit provided in a memory chip.

Attempts are now under way to lower the source voltages of semiconductor integrated circuits including semiconductor memories. Flash memories are no exception, and such memories operating at lower than previous source voltages, for instance 3.3 V to 1.8 V, have come to be required. There are two types of flash memories, one type using hot electrons for writing into, and using the FN tunnel phenomenon for erasing any content from, memory cells and the other type using the FN tunnel phenomenon for both writing and erasion. The latter, using the FN tunnel phenomenon for both writing and erasion, requires a higher boosted voltage than the former.

In recent years, techniques regarding so-called multi-value memories, in which data of two or more bits are to be stored in a memory cell, have come to be proposed with a view to increasing the memory capacities of flash memories. In such multi-value memories, the threshold voltage is varied stepwise, for instance from 1 V to 2 V, 3 V and so forth and plural-bit information is stored, being matched with each threshold voltage, to control the quantity of electric charges injected into the floating gate. In order to set one memory cell to one of a plurality of threshold voltages and to read out the stored information accurately, it is necessary to provide some differences in potential in the distribution of the multiple threshold voltages, and consequently the overall potential difference in the distribution of threshold voltages becomes greater than for two-value memory cells. As a result, a higher boosted voltage is required in writing and erasion into and out of multi-value memories than in two-value memories.

A conventional voltage booster circuit using an ordinary charge pump involves a problem that the voltage cannot be boosted by no more than five times approximately, and boosting the voltage beyond a certain boosted level would suffer a sudden drop in efficiency, namely the saturation of boosted voltage.

There are two types of conventional charge pumps, a parallel capacity type as shown in FIG. 16 and a serial capacity type as shown in FIG. 17. Of the two types, a parallel capacity type charge pump shown in FIG. 16, first as shown in FIG. 16(A), charges up the capacities by applying a low source voltage Vss, such as a ground potential, to a first terminal (the lower terminal in the diagram) of a capacity C1 and a source voltage Vcc higher than Vss via a diode D1 to a second terminal (the upper terminal in the diagram). Then, as shown in FIG. 16(B), it operates so as to switch the voltage at the first terminal of the capacity C1 from the source voltage Vss to Vcc in a state wherein the source voltage Vss is applied to a first terminal of the adjoining capacity C2.

This results in voltage boosting of the second terminal of the capacity C1 to 2 Vcc and transfer to the charge on the capacity C1 to the capacity C2 via a diode D2. By repeating such operations to successively transfer charges on capacities, boosted voltages can be obtained, such as from 2 Vcc to 3 Vcc and to 4 Vcc. When the charge on the capacity C2 is to be transferred to the next stage, precharging for the next charge transfer at the capacity C1 of the first stage makes possible efficient voltage boosting. However, in a parallel capacity type charge pump, the presence of diodes intervening between the capacities invites a reduction of the transmitted voltages by as much as the voltages of these diodes in the forward direction.

It is conceivable to use switching elements, such as MOSFETs, instead of the diodes here, but also in that case, diode-connected MOSFETs, in which the gate and drain are coupled, the voltage will drop by as much as the threshold voltage. Or where switching MOSs are used, as is evident from FIG. 16, the voltage relationship between the source and drain of the switching MOSs is reversed. In other words, the source voltage may become either lower or higher than the drain voltage.

If, in an attempt to avoid it, P channel type switching MOSs are used, their well region will be of an N type, and if a configuration is so designed that the same voltage as in the source region, where the potential is high, be applied to the well region as in usual MOSFETs, when the potential in the drain region rises, the PN junction with the well region will be biased forward to let a current flow. Therefore, P channel type MOSFETs cannot be used. On the other hand, if N channel type switching MOSs are used, the transmitted voltage is reduced by as much as the threshold voltage of the MOSFETs because of their characteristics, and eventually it is difficult to boost the voltage without entailing a voltage drop.

A serial capacity type charge pump, as shown in FIG. 17, charges capacities C1, C2 and C3 in series in the same direction up to the source voltage Vcc with switches S1, S2 and S3 between the capacities C1, C2 and C3 kept in an off state as shown in FIG. 17(A). Then, as shown in FIG. 17(B), the switches S1, S2 and S3 between the capacities C1, C2 and C3 are turned on, and the charge pump is operated so as to switch the voltage of a first terminal (the left side terminal in the diagram) of a first capacity C1 from the source voltage Vss to Vcc. Then, the voltage of a second terminal of the capacity C1 will rise to 2 Vcc, and the voltages of second terminals of capacities C2 and C3 will rise to 3 Vcc and 4 Vcc as, though the inter-terminal voltages of the capacities C2 and C3 are respectively charged source voltages Vcc, the voltage of each first terminal is switched from Vss to the voltage of the second terminal of the adjoining capacity. Thus, boosted voltages are obtained.

However, while it is effective in reducing the capacity size, in a serial capacity charge pump, to use capacities between the well region and the gate region, utilizing the gate oxide film of MOSFET, which is the thinnest among all the capacities, the actual circuit of such a configuration in this case would be such that capacities Cs of PN junction between the well region and the substrate are connected to capacities C1, C2 and C3 as shown in FIG. 17. As a result, when switches S1, S2 and S3 between the capacities C1, C2 and C3 are turned on, part of the charges on the capacity at the preceding stage is consumed to charge the parasitic capacity Cs of the next stage, and the boosted voltage will be reduced correspondingly.

SUMMARY OF THE INVENTION

According to what the present inventors studied, a multi-value flash memory requires a high voltage of $\mp 16$ V or more for writing into and erasing any content out of memory cells, and it has been revealed that, where the source voltage is 1.8 V, a booster circuit capable of generating a voltage 10 times as high as thee source voltage, or even higher, will be needed.

Then, the inventors thought a high boosted voltage could be generated by combining the aforementioned two types of charge pumps, and studied this concept. They arrived at an idea that by using a parallel capacity type charge pump for the first stage of voltage boosting and a serial capacity type charge pump for the second stage of voltage boosting, a high boosted voltage could be obtained. Incidentally, inventions regarding the generation of a boost voltage by combining two or more charge pumps are disclosed in, for instance, the Japanese Unexamined Patent Applications Nos. Hei 3(1991)-73565, 5(1993)-28785 and 6(1994)-208798 (U.S. Pat. No. 5,280,420).

However, any of the prior inventions providing for a combination of two or more charge pumps either specifies the types of charge pumps to be combined or the combination of parallel capacity type charge pumps alone, but none achieves so high a boosted voltage that charge pumps of any single type can attain by tactfully combining charge pumps of the pump parallel capacity and serial capacity types to take advantage of the strong points of both.

An object of the present invention is to provide a voltage booster circuit, for use in a semiconductor integrated circuit having an internal booster circuit such as a flash memory, capable of generating a boosted voltage 10 times or more as high as a relatively low source voltage.

Another object of the invention is to provide a voltage booster circuit, for use in a semiconductor integrated circuit having an internal booster circuit such as a flash memory, capable of efficiently generating a boosted voltage by discriminatively using one or another of different types of charge pumps according to the type of the circuit to receive the supply of the boosted voltage generated by the booster circuit.

Still another object of the invention is to reduce the consumption of power by a semiconductor integrated circuit having an internal booster circuit such as a flash memory by selectively operating charge pumps according to the operating mode.

Yet another object of the invention is to provide a voltage booster circuit, for use in a semiconductor integrated circuit having an internal booster circuit such as a flash memory, capable of generating a stable boosted voltage irrespective of the levels of source voltage and power consumption.

These and other objects and novel features of the present invention will become apparent from the description in this specification when taken in conjunction with the accompanying drawings.

Typical aspects of the invention disclosed in this application will be summarized below.

Thus, in a semiconductor integrated circuit provided with an internal booster circuit, a charge pump for carrying out voltage boosting of a first stage based on a source voltage is configured of a parallel capacity type unit and another charge pump for carrying out voltage boosting of a second stage based on the boosted voltage generated by the foregoing charge pump is configured of a serial capacity type unit.

A serial capacity type charge pump has characteristic in which it is easy to design from its voltage resistance aspect because voltages applied to voltage boosting capacities of different stages arranged in series are substantially equal though, with an increase in the number of stages, the voltage reached quickly saturates as charges are spent by parasitic capacities. On the other hand, a parallel capacity type charge pump has characteristic in which it is less subject to saturation of the boosted voltage than the serial capacity type even if the number of stages is somewhat large though its voltage resistance is not sufficient to be compatible with a high boosted voltage because voltages applied to voltage boosting capacities of different stages arranged in parallel differ from one another and are higher in later stages. Therefore, by configuring the charge pump for voltage boosting at the first stage of a parallel capacity type unit and configuring the charge pump for voltage boosting at the second stage of a serial capacity type unit, a relatively high boosted voltage can be generated more efficiently than in a reverse case.

More preferably, the parallel capacity type charge pump for the first stage of voltage boosting should be provided in divided units according to the types of circuits to which the generated voltage is supplied. More specifically, it is preferable to provide separate charge pumps according to the type of the types of circuits to which the generated voltage is supplied, differentiated between a capacitive load and a resistive load.

The configuration described above permits control to reduce power consumption by stopping the operation of one of the charge pumps according to the mode of operation or by switching the frequency of operating clocks, and to reliably generate a boosted voltage of a desired level even if the source voltage is low.

Further, the parallel capacity type charge pump for the first stage of voltage boosting may be configured of capacities each using a gate insulating film differing in thickness from the others, the thickness increasing with the level of the boosted voltage. This makes it possible for capacities on the lower voltage side to occupy less space to achieve a prescribed capacitance because of their smaller insulating film thickness and capacities on the higher voltage side to be made more resistant to voltage by their greater insulting film thickness, resulting in assured reliability.

In particular in a nonvolatile memory, such as a flash memory, wherein memory cells are configured of MOSFETs of a double gate structure having a floating gate and a control gate, a first gate insulating film (tunnel insulating film) under the floating gate is formed thinner than a second gate insulating film between the floating gate and the control gate, and therefore these gate insulating films are used as two types of insulating films for capacities within the charge pump. In this way, a charge pump having capacities using two different types of insulating films can be realized and any additional cost can be avoided.

Further, where the level of the externally supplied source voltage drops of the power consumption of the parallel capacity type charge pump for the first stage of voltage boosting increases, control is so effected as to lower the frequency of signals to operate the serial capacity type charge pump for the second stage of voltage boosting, such as clock signals. This ensures appropriate operation both in circuits running on the boosted voltage from the charge pump for the first stage of voltage boosting and in circuits running on the boosted voltage from the charge pump for the second stage of voltage boosting.

Moreover, in a semiconductor integrated circuit such as a flash memory, circuits running on the boosted voltage of the second stage are circuits for write and erasion and, only if the voltage level is assured for them, no fatal trouble can occur even if some time is taken to reach a desired level. On the other hand, the undesirable eventuality that chips are prevented from operating by the failure of the boosted voltage to attain the target level can be averted, because the boosted voltage can reach the desired level even if it has to be awaited for some time.

DESCRIPTION OF THE PREFERRED EMBODIMENTS

Preferred embodiments of the present invention, in each of which a voltage booster circuit according to the invention is applied to a flash memory will be described below with reference to drawings.

Figure 1:
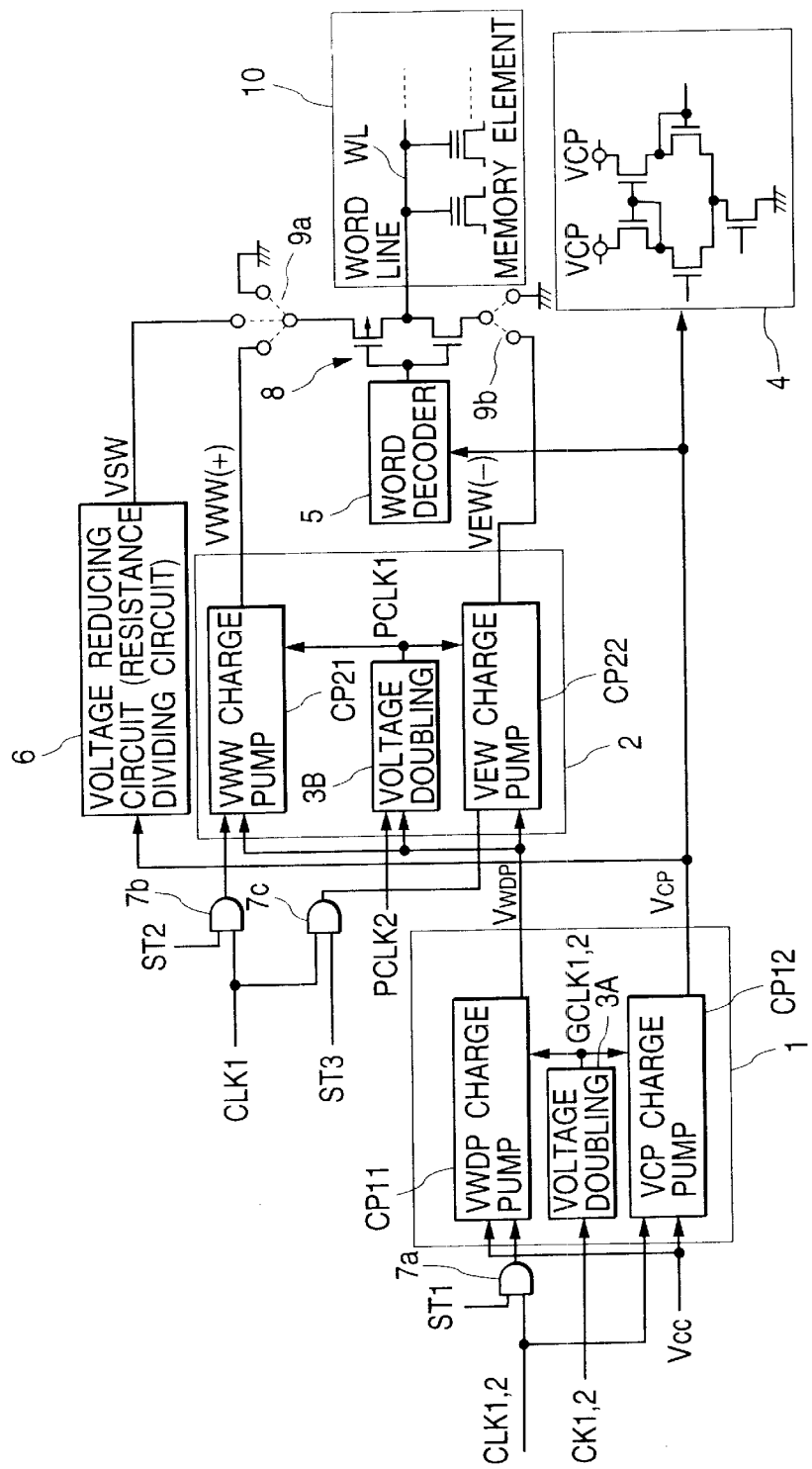
FIG. 1 is a block diagram illustrating a voltage booster circuit, which is a first preferred embodiment of the present invention.

FIG. 1 schematically illustrates the configuration of an internal power supply circuit in a flash memory provided with a voltage booster circuit according the invention. In FIG. 1, reference numeral 1 denotes a first voltage booster circuit to carry out voltage boosting at a first stage on the basis of a source voltage Vcc from outside; and 2, a second voltage booster circuit to carry out voltage boosting at a second stage on the basis of a voltage VWDP boosted by the first voltage booster circuit. In this embodiment, the first voltage booster circuit 1 is provided with two charge pump circuits CP11 and CP12 of a parallel capacity type. On the other hand, the second voltage booster circuit 2 is provided with two charge pump circuits CP21 and CP22 of a serial capacity type. The parallel capacity type charge pump circuits CP11 and CP12 of the first voltage booster circuit 1 may generate boosted voltages VWDP and VCP of, but not limited to, 7 v on the basis of a source voltage Vcc of 1.8 V to 3.3 V.

Out of the serial capacity type charge pump circuits CP21 and CP22 of the second voltage booster circuit 2, CP21 generates a positive write voltage VWW of +16 V or the like to be applied to a word line WL, which is a capacitive load in a memory array comprised of nonvolatile memory elements, while CP generates a negative erase voltage VEW of −16 V or the like to be applied to the word line WL. Out of the parallel capacity type charge pump circuits CP11 and CP12 of the first voltage booster circuit 1, CP11 supplies a voltage VWDP it has boosted to the second voltage booster circuit 2, while CP12 supplies a voltage VCP it has boosted to an internal logic gate circuit 4, a word decoder circuit 5, a voltage reducing circuit 6 consisting of a resistance dividing circuit or the like and generating a read voltage VSW to be applied to the word line WL and the like, which are resistive loads.

Here, the internal logic gate circuit 4, which is a resistive load, does not mean a logic gate circuit constituting an address buffer or a data buffer operating on an external source voltage Vcc, but means such a logic gate circuit as a decoder circuit provided relatively close to the memory array 10, a direct control circuit for determining the completion writing or erasion, or a power source switching circuit which operates on an internally boosted voltage and determines logic by the flow of a current.

Further, the first voltage booster circuit 1 and the second voltage booster circuit 2 are respectively provided with voltage doubling circuits 3A and 3B for doubling the amplitudes of clocks CK1 and CK2 respectively supplied to them. Of these circuits, the voltage doubling circuit 3A is configured to generate clocks GCLK1 and GCLK2 having amplitudes of 2 Vcc on the basis of an external source voltage Vcc, while the voltage doubling circuit 3B is configured to generate a clock PCLK1 having an amplitude of 2VWDP on the basis of a boosted voltage VWDP generated by the voltage booster circuit 1.

The clocks CK1, CK2, CLK1, CLK2 and PCLK2 are supplied from a clock generator (see reference numeral 34 in FIG. 9) within the chip. The configuration is such that the supply of the clocks to the charge pumps CP11, CP21 and CP22 can be intercepted by gates 7a, 7b and 7c controlled by start signals ST1, ST2 and ST3 from a control circuit, and any charge pump to which clock supply is intercepted stops boosting the voltage.

In the embodiment shown in FIG. 1, reference numeral 8 denotes a word driver responsive to a selection signal from the word decoder circuit 5 for driving the word line WL at a prescribed level according to the mode of operation; and 9a and 9b, voltage change-over switches for selecting voltages according to the mode of operation and supplying them to the word driver 8.

As described above, in this embodiment, the voltage booster circuit 1 for the first stage of voltage boosting is configured of the two parallel capacity type charge pumps CP11 and CP12, and a boosted voltage VWDP generated by one of them is supplied to circuits which constitute capacitive loads, while the boosted voltage VCP generated by the other is supplied to circuits constituting resistive loads. Therefore, control is possible so as to stop the operation of one of the charge pumps according to the mode of operation and thereby save the consumption of power, also to save power consumption by switching the frequency of operating clocks, and to generate a boosted voltage of a desired level without fail even if the source voltage is low.

More specifically, in the flash memory according to this embodiment, while the charge pump CP12 for generating the boosted voltage VCP operates in any mode of operation, i.e. all the time, because it supplies operating power to the internal logic gate circuit 4 and the resistance dividing circuit 6 which constitute resistive loads, the operation of the charge pump CP11 to generate the boosted voltage VWDP is stopped to save power consumption in the reading mode, wherein no high boosted voltage is required. When the operation of the charge pump CP11 to generate the boosted voltage VWDP is stopped, the operations of the charge pumps CP21 and CP22 of the voltage booster circuit 2 for carrying out the second stage of voltage boosting on the basis of this boosted voltage VWDP are also stopped. The operations of the charge pumps CP11, CP21 and CP22 can be stopped by suspending the supply of operating clocks with the start signals ST1, ST2 and ST3.

Furthermore, as the voltage booster circuit 1 for the first stage of voltage boosting is configured of the two parallel capacity type charge pumps CP11 and CP12, and the charge pumps CP21 and CP22 of the voltage booster circuit 2 for carrying out the second stage of voltage boosting in response to the boosted voltage VWDP generated by CP11 are connected only to capacitive loads, voltage boosting to a desired level is possible, even when the level of the externally supplied source voltage Vcc drops or is low from the outset resulting in an insufficient capability of supply to the charge pump CP11 for generating the boosted voltage VWDP, if the frequency of the clocks to operate the charge pumps CP21 and CP22 is lowered to give a sufficient length of time, and the proper operation of the chip is thereby assured. This switching of clock frequency will be explained more specifically and in more detail with reference to another embodiment to be described later.

Further in the embodiment shown in FIG. 1, out of the charge pumps CP21 and CP22 of the voltage booster circuit 2 for carrying out the second stage of voltage boosting, one generates the positive boosted voltage VWW for writing while the other generates the negative boosted voltage VEW for erasing. Therefore, power consumption can be saved by effect control so as to stop the operation of the charge pump CP22 in the writing mode and the operation of the charge pump CP21 in the erasion mode.

Figure 2:
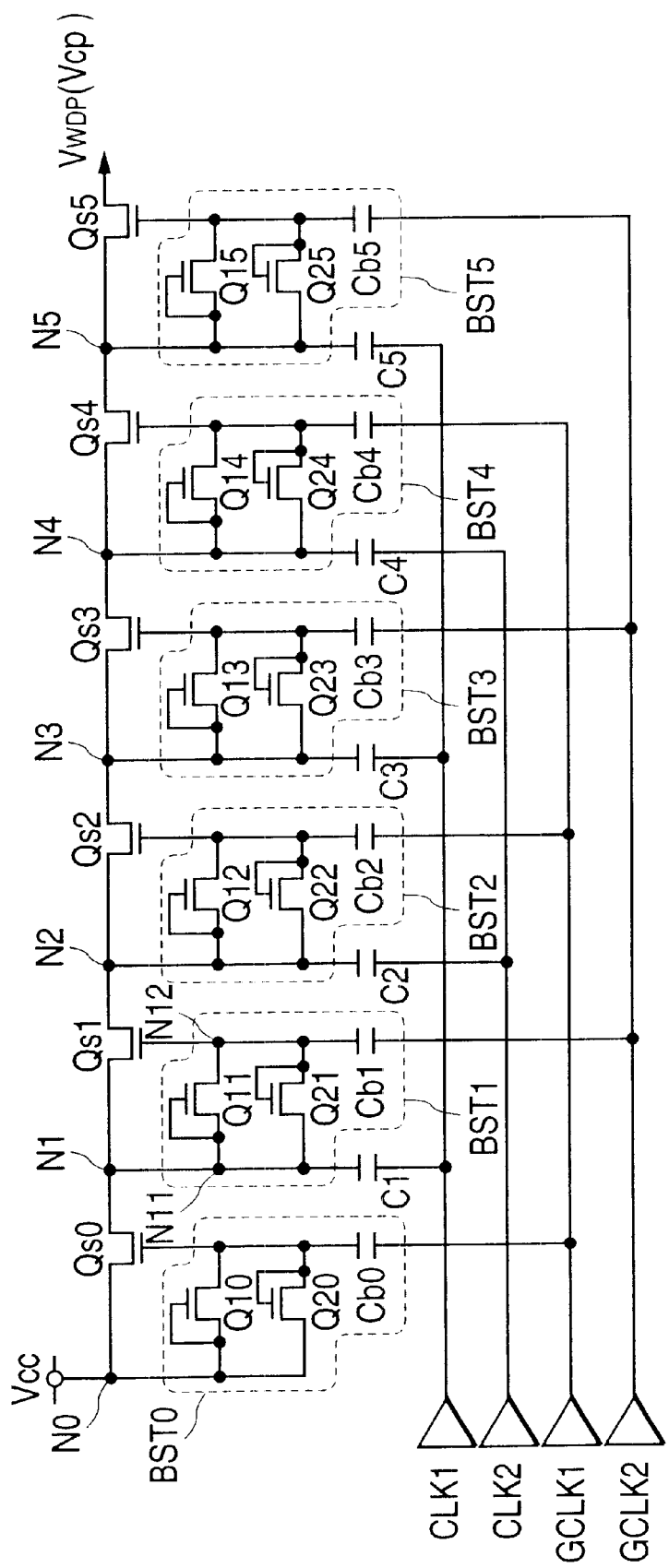
FIG. 2 is a circuit diagram illustrating an example of parallel capacity type charge pump for the first stage of voltage boosting.
Figure 16A:
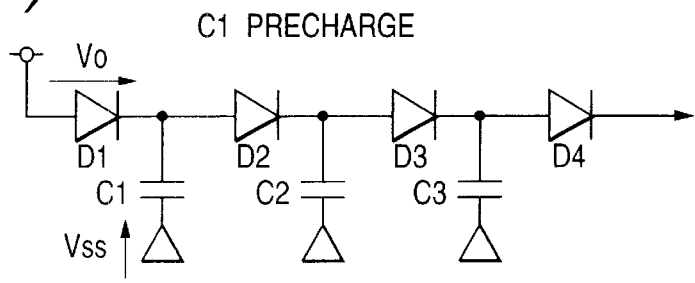
FIGS. 16a & 16b is a circuit diagram illustrating an example of configuration of parallel capacity type charge pump according to the prior art and its operation.
Figure 16B:
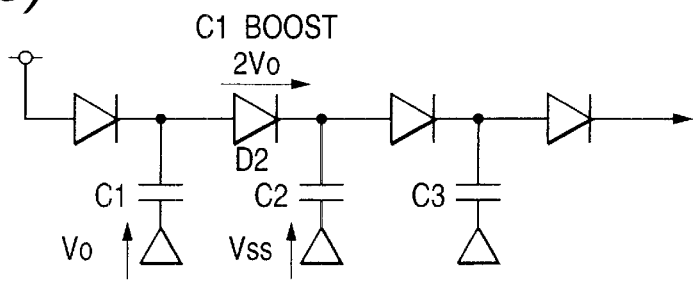
Figure 17A:
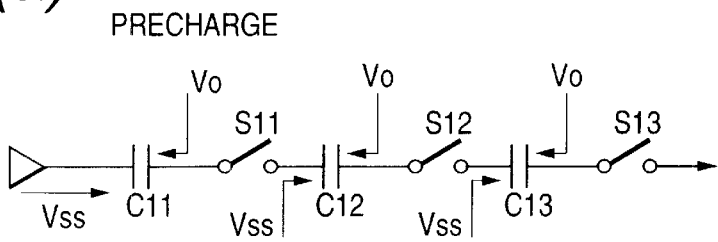
FIGS. 17a & 17b is a circuit diagram illustrating an example of configuration of serial capacity type charge pump according to the prior art and its operation.
Figure 17B:
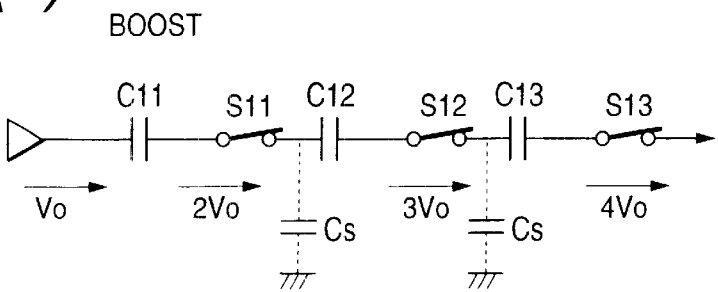

Next, a specific example of circuit configuration for the parallel capacity type charge pumps CP11 and CP12 of the voltage booster circuit 1 for carrying out the first stage of voltage boosting will be described with reference to FIG. 2. The charge pumps shown in FIG. 2 are configured of five-stage voltage boosting capacities C1 through C5 arranged in parallel, switch MOSFETs Qs1 through Qs4 provided between charging side terminals (nodes N1 through N5) of the capacities, a switch MOSFET Qs0 capable of applying the external source voltage Vcc to the charging side terminal (node N1) of the first stage capacity C1, a switch MOSFET Qs5 for transmitting the voltage VWDP (VCP) at the charging side terminal (node N5) of the final stage capacity C5 to circuits on the voltage supply receiving side, and booster circuit BST0 through BST5 for boosting gate voltages for sufficiently turning on the switch MOSFETs Qs0 through Qs5. Of these elements, the switch MOSFETs Qs0 through Qs5 function as diodes in the circuits illustrated in FIG. 16.

Figure 3:
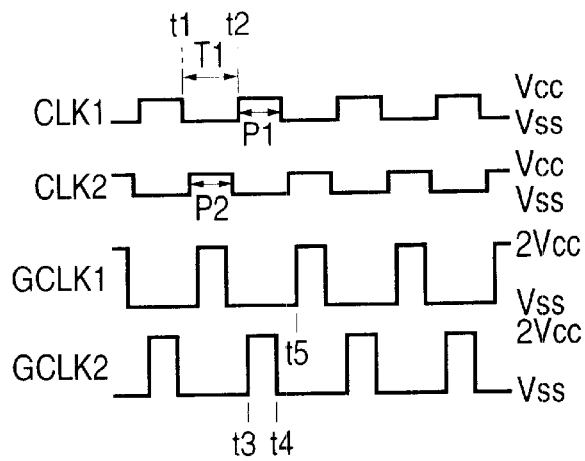
FIG. 3 is a timing chart showing the timing of operating clocks for the charge pump of FIG. 2.

To reference side terminals (terminals opposite to the charging side terminals) of the odd-numbered capacities C1, C3 and C5 out of the voltage boosting capacities C1 through C5 are applied clocks CLK1 having an amplitude of 0 V to Vcc as shown in FIG. 3. To reference side terminals of the even-numbered capacities C2 and C4 are applied clocks CLK2 having an equal amplitude of 0 V to Vcc so that their high-level periods do not overlap those of the clocks CLK1. Control to have these substantially reversed phase clocks CLK1 and CLK2 alternately hit (abruptly raise) the reference side terminals of the odd-numbered capacities C1, C3 and C5 and the even-numbered capacity C2 and C4 and at the same time to have the switch MOSFETs Qs0 through Qs5 operate similarly to diodes shown in FIG. 16 causes the charge on C1 to be transferred successively to C2, C3, C4 and C5 to generate boosted voltages.

The booster circuits BST0 through BST5 controlling the switch MOSFETs Qs0 through Qs5 are configured of first MOSFETs Q10 through Q15 whose sources and drains are connected to the gate terminals and former stage side nodes N0 through N4 of the respectively matching switch MOSFETs Qs0 through Qs5; second MOSFETs Q20 through Q25 connected in parallel with the MOSFETs Q10 through Q15; and instantaneous booster capacities Cb0 through Cb5 of which one terminal of each is connected to the gate terminal of the matching one of the switch MOSFETs Qs0 through Qs5. The instantaneous booster capacities Cb0 through Cb5 are supposed to have sufficiently smaller capacitances than the booster capacities C1 through C5.

The configuration is such that the gates and drains of the first MOSFETs Q10 through Q15 are coupled and function as diodes to make currents flow to the former stage side to the gates of Qs0 through Qs5, and the gates and drains of the second MOSFETs Q20 through Q25 are coupled and function as diodes to make currents flow, conversely to those of Q10 through Q15, from the gates of Qs0 through Qs5 to the former stage side. To reference side terminals (terminals opposite to the terminals connected the terminals of Qs0 through Qs5) of the even-numbered Cb0, Cb2 and Cb4 out of the booster capacities Cb0 through Cb5 are applied clocks GCLK1 having an amplitude of 0 V to 2 Vcc, whose pulse width is narrower than the pulse width P2 of the clocks CLK2. To reference side terminals of the odd-numbered booster capacities Cb1, Cb3 and Cb5 are applied clocks GCLK2 having an amplitude of 0 V to 2 Vcc having a narrower pulse width than the pulse width P1 (=P2) of the clocks CLK1 so that their high-level periods do not overlap those of the clocks GCLK1.

The actions of the booster circuits BST0 through BST5 will be described below with focuses on the booster circuit BST1, the booster capacity C1, the boost capacity Cb1 and the switch MOSFET Qs1. First, the focus will be on a period T1 wherein the clock CLK1 applied to the reference terminal side of the capacity C1 is at a low level in a constant state. By this time the capacity C1 is already charged to Vcc by the former stage switch MOSFET Qs0, and the potential at the node N11 is Vcc. The clock GCLK2 applied to the reference terminal side of the boost capacity Cb1 is also at a low level. As a result, even if the gate side terminal of Qs1 of the boost capacity Cb1 should be charged to rise the potential at the node N12 beyond Vcc, the diode-connected MOSFET Q21 would be turned on to shift the charge to the node N11 side to make the potential at the node N12 higher than that at N11 only by the threshold voltage Vth of the MOSFET Q21.

Then, as the clock CLK1 varies from a low level to a high level at a timing t2, the reference side terminal of the booster capacity C1 is hit by the clock CLK1 to vary the potential at the node N11 to 2 Vcc. As the clock GCLK2 is still at a low level then, the diode-connected MOSFET Q11 is turned on to shift the charge from the node N11 to the node N12. As the capacitance of the boost capacity Cb1 is sufficiently smaller of the booster capacity C1 then, the level drop at the node N11 due to the shift of the charge is negligibly small. The potential at the node N12 will be 2 Vcc-Vth, lower than 2 Vcc, which is the potential at the node N11, by the threshold voltage Vth of the MOSFET Q11.

Then, as the clock GCLK2 varies from a low level to a high level (2 Vcc) at a timing t3, the reference side terminal of the booster capacity C1 is hit by the clock GCLK2 to vary the potential at the node N12 to 2 Vcc–Vth+2 Vcc. As a result, the MOSFET Qs1, even though it is of an N channel type, is sufficiently turned on by the raise of its gate voltage to a potential higher than the potential 2 Vcc of the node N1 by almost 2 Vcc. The charge on the node N1 is shifted to the node N2 to charge the booster capacity C2 of the next stage, and the potential at the node N2 will be 2 Vcc, without being brought down by Qs1. In parallel with the shift of the charge from the node N1 to the node N2, the diode-connected MOSFET Q21 is turned on to shift the charge from the node N12 to the node N11, and the potential at the node N12 will return to a higher level than the potential at the node N11 by as much as the threshold voltage Vth of the MOSFET Q21.

Next, as the clock GCLK2 varies from a high level (2 Vcc) to a low level at a timing t4, the potential at the node N12 varies to a level lower by 2 Vcc. As a result, after the MOSFET Qs1 is turned off to prevent crosscurrent from the node N2 to the node N1, the clock CLK1 varies from a high level to a low level, and the potential at the node N1 drop to below Vcc. After that, the variation of the clock GCLK1 from a low level to a high level (2 Vcc) at a timing t5 turns the switch MOSFET Qs0 on to charge the booster capacity C1 to Vcc again.

The booster capacity C2 at the next stage, receiving the boosted voltage 2 Vcc from the booster capacity C1 of the preceding stage, carries out the same voltage boosting action as before according to the clocks CLK2 and GCLK1 a half period behind the capacity C1, generates a voltage of 3 Vcc, higher than 2 Vcc by Vcc, and transmits it to the next stage. In this manner, the charge pumps in this embodiment can ultimately generate a boosted voltage VWDP (VCP) almost six times as high as Vcc.

Though not shown in FIG. 2, a limiter circuit is provided on the output terminal side of this voltage booster circuit to prevent the boosted voltage from exceeding a desired level. In this embodiment, the voltage booster circuit is designed to be able to generate a boosted voltage of about 10 V from a source voltage Vcc in the order of 1.8 V, and the limiter circuit is designed to limit the generated voltage to about 7 V, though the rates are not limited to these. This arrangement makes it possible to supply a stable boosted voltage even if the source voltage Vcc is below 3 V or power consumed by load circuits increases.

As described above, the parallel capacity type charge pump circuit in this embodiment theoretically can boost the voltage to an even higher level as there is no potential drop in the switch MOSFETs Qs0 through Qs5 and the boosted voltage can be transmitted to the next stage. However, if the number of stages is further increased to generate an even higher boosted voltage without altering the circuitry of FIG. 2, the voltage applied to each capacity and MOSFET gate will become extremely high, giving rise to problems in the reliability of devices, including destruction of insulating films. In view of these potential problems, according to the present invention, the voltage booster circuit is divided into the first voltage booster circuit for voltage boosting at the first stage and the second voltage booster circuit for voltage boosting at the second stage, and the second voltage booster circuit is configured of serial capacity type charge pumps to ensure the reliability of devices.

Figure 4:
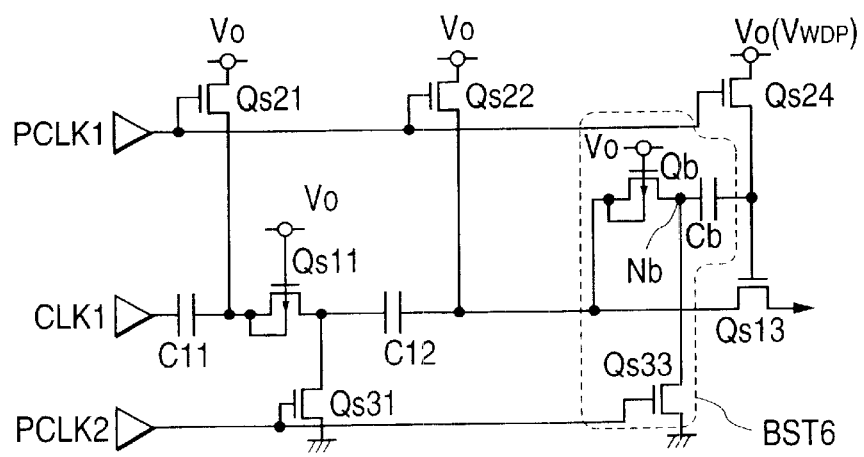
FIG. 4 is a circuit diagram illustrating an example of serial capacity type charge pump for the second stage of voltage boosting.

Next, an example of charge pump CP21 for generating a positive boosted voltage out of the serial capacity type charge pumps CP21 and CP22 of the second voltage booster circuit 2 with reference to FIG. 4.

The charge pump shown in FIG. 4 is configured of two-stage booster capacities C11 and C12 connected in series via a MOSFET; a switch MOSFET Qs11 capable of connecting and disconnecting the capacities; a switch MOSFET Qs13 for transmitting the voltage VW (VEW) of the charging side terminal of the final stage capacity C12; switch MOSFETs Qs21 and Qs22 connected between charging side terminals (high potential side terminals) and source voltage terminals V0 of the capacities; a switch MOSFET Qs31 connected between the reference side terminal (low potential side terminal) of the second stage capacity C12 and a ground potential Vss (0 V); a switch MOSFET Qs24 connected between the gate terminal and the source voltage terminal V0 of the switch MOSFET Qs13; and a booster circuit BST6 for boosting the gate voltage to sufficiently turn on the final stage switch MOSFET Qs13. Of these elements, the switch MOSFETs Qs11 and Qs13 are intended to function as switches in the circuit shown in FIG. 14.

The booster circuit BST6 is configured of a MOSFET Qb and an instantaneous booster capacity Cb connected in series between charging side terminal (high potential side terminal) of the booster capacity C13 and the gate terminal of the final stage switch MOSFET Qs13; and a switch MOSFET Qs33 connected between the Qb-Cb connection node Nb and the ground potential Vss (0 V). Out of the switch MOSFETs Qs11 and Qs13, Qs11 and the MOSFET Qb of the booster circuit are of the P channel type, and they are usually placed in an off state by the application of a voltage V0 to their gate terminals. This is because, between the potentials of the sources and drains of the MOSFETs Qs11 and Qb, either they are the same or the potential is higher at the node on the former stage side is higher but never higher at the node on the latter stage side. Thus, by connecting the well regions of the MOSFETs Qs11 and Qb to the node at the former stage, they can be used P channel MOSFETs whose well regions are of the N type. By making the MOSFET Qs11 a P channel type unit, a voltage boosted at a former stage can be transmitted to a latter stage without suffering a potential drop (Vth drop).

On the other hand, for the switch MOSFET Qs13, an N channel unit is used because the source-drain relationship in potential is not fixed, and the booster circuit BST6 is provided to transmit a voltage boosted at a former stage to a latter stage without suffering a potential drop (Vth drop). Similarly, for the switch MOSFET Qs21, Qs22 and Qs24 to precharge both terminals of the booster capacities C11 and C12 by applying a voltage V0, N channel type units are also used because the source-drain relationship in potential is not fixed. However, as N channel type MOSFETs whose charge voltage is V0 may suffer a potential drop, clocks PCLK1 having an amplitude of 2V0 as shown in FIG. 5 are applied to the gate terminals of Qs21, Qs22 and Qs24.

Figure 5:
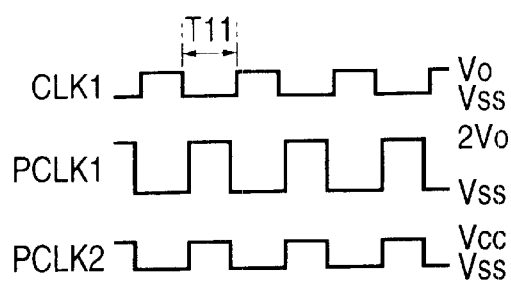
FIG. 5 is a timing chart showing the timing of operating clocks for the charge pump of FIG. 4.

For the MOSFETs Qs31 and Qs33, N channel type units are used to supply a ground potential Vss to one terminal each of the booster capacity C12 and of the boost capacity Cb, and to their gate terminals are applied clocks PCLK2 having an amplitude of Vcc as shown in FIG. 5. The clock PCLK1 is reverse in phase to the clock CLK1 of V0 in amplitude applied to the reference side terminal of the first stage booster capacity C1, and the clock PCLK2 is in the same phase as PCLK1.

The charge pump circuit embodying the invention in this way uses as its operating voltage V0 the boosted voltage VWDP generated by the parallel capacity type charge pump CP11. During the period wherein the clock CLK11 applied to reference side terminal of the first the stage booster capacity C11 is kept at a low level, the booster capacities C11 and C12 are precharged to V0 by varying the clocks PCLK1 and PCLK2 to a high level to turn on the switch MOSFETs Qs21, Qs22, Qs24 and Qs31. Then, the switch MOSFETs Qs21, Qs22, Qs24 and Qs31 are turned off to intercept both terminals of the booster capacities C11 and C12 from the source voltage terminals and the grounding terminal, and the clock CLK1 is varied to a high level. Then, the switch MOSFET Qs11 is automatically turned on as the potential at the former side node, i.e. the source potential, is made higher than the gate potential (=V0), and the booster capacities C11 and C12 are placed in a serially connected state. As a result, a boosted voltage substantially equivalent to the total of the precharge voltages of the booster capacities C11 and C12 (=3V0) is generated.

At this time, in the booster circuit BST6, when the booster capacity Cb is precharged to V0 at the same time with the precharging of the booster capacities C11 and C12 to vary the clocks CLK1 to a high level, turning on of Qb like the switch MOSFETs Qs11 and Qs12 boosts the gate voltage of the final stage switch MOSFET Qs13 to a potential higher than the potential at the former stage node (source potential) by the precharge voltage V0 to turn on it sufficiently. The boosted voltage generated by the capacities C11 and C12 can be transmitted to latter stage circuits without suffering a potential drop.

Figure 6:
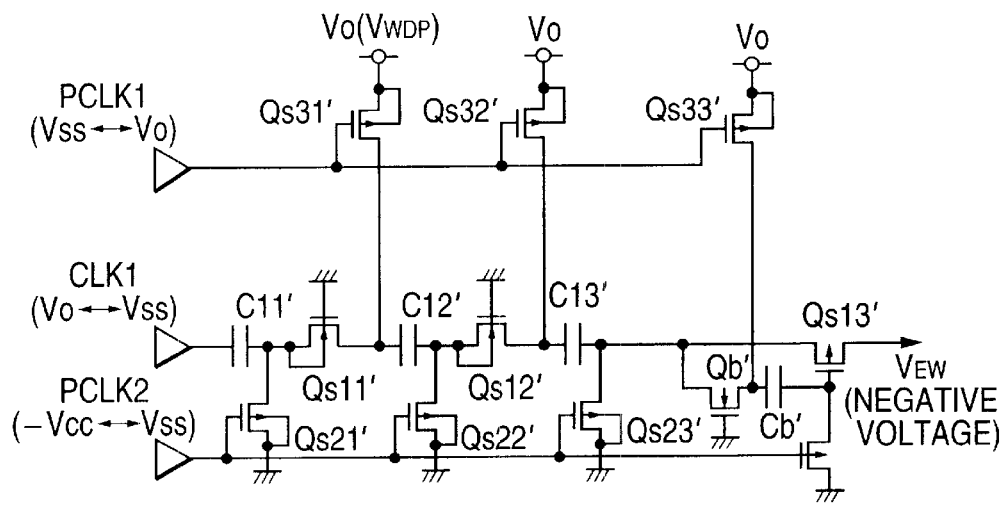
FIG. 6 is a circuit diagram illustrating an example of negative voltage generating serial capacity type charge pump for the second stage of voltage boosting.
Figure 7A:
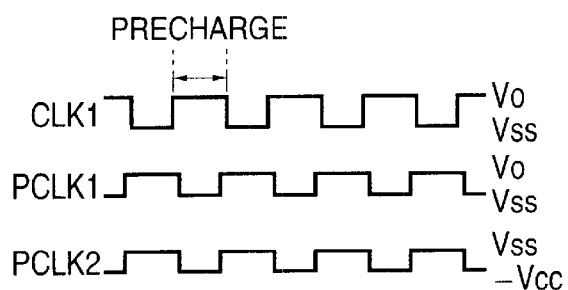
FIGS. 7a & 7b consists of a timing chart showing the timing of operating clocks for the charge pump of FIG. 6 and a state diagram illustrating the charged state of each voltage booster capacity at the time of precharging.
Figure 7B:
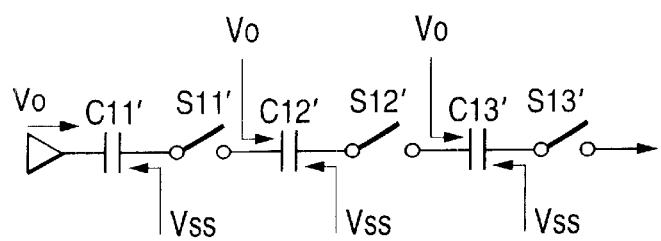

FIG. 6 illustrates an example of charge pump CP22 generating a negative boosted voltage VEW out of the serial capacity type charge pumps CP21 and CP22 of the second of voltage booster circuit; FIG. 7(a), operating clock waveform; and FIG. 7(b), the voltages applied to the booster capacity C11' through C13' and the states of switches S11' through S13' at the time of precharging.

The differences between the charge pump of FIG. 6 and that of FIG. 4 include that the conductivity patterns of the MOSFETs used are reverse, i.e. N-MOS is used in FIG. 6 in place of P-MOS in FIG. 4 and P-MOS is used in place of N-MOS; that the directions of charging are reverse between the booster capacities C11 and C12 in the serial form on one hand and C11' through C13' on the other at the time of precharging; and that the timings of the clocks CLK1, PCLK1 and PCLK2 are different; while in the charge pump of FIG. 4 a ground potential Vss is applied to the reference side terminal of the first stage booster capacity C11 at the time of precharging to raise Vo during the voltage boosting operation, in the charge pump of FIG. 6 a source voltage V0 is applied to the reference side terminal of the first stage booster capacity C11' and a negative voltage is generated by lowering it to a ground potential Vss during the voltage boosting operation.

Next will be described with reference to FIG. 8 structural features of capacity elements particularly inventive in the parallel capacity type charge pumps CP11 and CP12 and the serial capacity type charge pumps CP21 and CP22 of this embodiment.

Figure 8A:
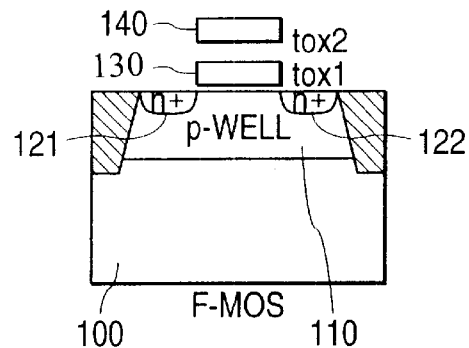
FIGS. 8a, 8b & 8c consists of sectional views illustrating the structure of a nonvolatile memory element and the structure of a voltage booster capacity in a charge pump.
Figure 8B:
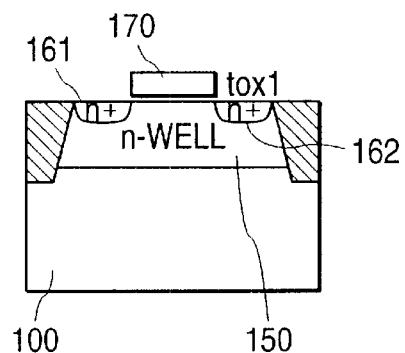

FIG. 8(a) illustrates the sectional structure of a MOSFET having a floating gate (hereinafter to be referred to as F-MOS) as a nonvolatile memory element to be provided in the memory array; FIG. 8(b), the sectional structure of first stage and second stage booster capacities C1 and C2 in the parallel capacity type charge pumps CP11 and CP12 and of capacities Cb0, Cb1 and Cb2 in the booster circuits BST0 through BST2; and FIG. 8(c), the sectional structure of the remaining booster capacities C3, C4 and C5 in the parallel capacity type charge pumps CP11 and CP12, of the capacities Cb3, Cb4 and Cb5 in the booster circuits BST3 through BST5, and of the capacities C11 through C13 and Cb in the serial capacity type charge pumps CP21 and CP22.

In FIG. 8(a), reference numeral 100 denotes a semiconductor substrate of monocrystalline silicon or the like; 110, a P type well region formed over the surface of the semiconductor substrate 100; 121 and 122, respectively N type source and drain regions formed at proper intervals over the surface of the P type well region 110; 130, a floating gate consisting of polysilicon or the like, formed via a first insulating film (not shown), such as a silicon oxide film, over the P type well region 110 between the source region and the drain region; and 140, a control gate-cum-word line consisting of polysilicon or the like, formed via a second insulating film (not shown), such as a silicon oxide film similarly, over this floating gate 130.

Further in FIG. 8(a), sign tox1 denotes the thickness of a first gate insulating film consisting of a silicon oxide film or the like, and tox2, similarly the thickness of a second gate insulating film. A value of, for instance, 9 nm is conceivable as tox1, and one of 14 nm, as tox2.

Figure 8C:
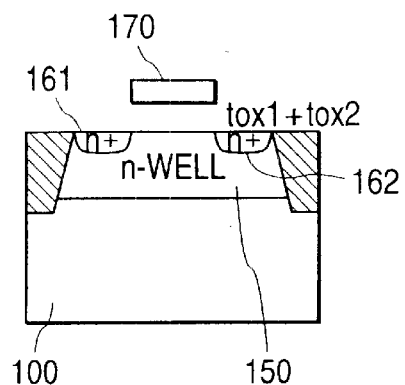

In FIGS. 8(b) and 8(c) on the other hand, reference numeral 150 denotes an N type well region which constitutes one of the electrodes of a capacity element formed over the surface of the semiconductor substrate 100; 161 and 162, high concentration N type regions for contact use formed over the surface of the N type well region 150; and 170, a conductive layer formed over the N type well region 150 via an insulating film (not shown) and constituting the other electrode of the capacity element. The high concentration N type regions 161 and 162 for contact use, unlike the source and drain regions 121 and 122 of the F-MOS in FIG. 8(a), can be formed in a ring shape surrounding the conductive layer 170.

A structural difference between the capacity shown in FIG. 8(b) and that in FIG. 8(c) consists in that the capacity in FIG. 8(c) has a thicker insulating film, which serves as a dielectric. More specifically, the insulating film of the capacity of FIG. 8(b) has a thickness of tox1 as it is formed simultaneously with the first gate insulating film of the F-MOS shown in FIG. 8(a). On the other hand, the insulating film of the capacity of FIG. 8(c) has a thickness of (tox1+tox2) as it is formed simultaneously with the second gate insulating film of the F-MOS shown in FIG. 8(a). This difference in thickness makes the capacity of FIG. 8(c) more voltage-resistant that the capacity of FIG. 8(b). However, the capacitance per unit square measure is greater for the capacity of FIG. 8(b), whose insulating film is thinner, than for the capacity of FIG. 8(c).

As in this embodiment, both the insulating film of the capacity of FIG. 8(b) and the insulating film of the capacity of FIG. 8(c) are formed simultaneously with the gate insulating film of the F-MOS, two kinds of capacity elements differing in voltage-resistance can be formed without having to add any new process. Furthermore, also regarding the conductive layer 170 to constitute the other electrode of each capacity, the conductive layer 170 of the capacity of FIG. 8(b) can be formed simultaneously with the floating gate of the F-MOS, and the conductive layer 170 of the capacity of FIG. 8(c), simultaneously with the control gate of the F-MOS. The high concentration N type regions 161 and 162 for contact use for each capacity can also be formed simultaneously with the N channel MOSFET. Furthermore, as regards the N type well region 150 to constitute one of the electrodes of the capacity, too, it can be formed simultaneously with the N type well region in which a P channel MOSFET (not shown FIG. 8) is formed. In this way, the two types of capacities shown in FIG. 8(b) and FIG. 8(c) can be formed without having to add no new process.

Incidentally, regarding the insulating film of the capacity of FIG. 8(c), it is also conceivable not to form, at the time of forming the first insulating film of the F-MOS, the first insulating film in these capacity formation regions or to form the second insulating film after removing the first insulating film which was already formed, but, by forming the first insulating film and further forming the second insulating film over it, a highly voltage-resistant capacity can as well be formed without having to add any new process. In the latter case, the thickness of the insulating film as the dielectric of the highly voltage-resistant capacity of FIG. 8(c) is the sum of the thickness of the first insulating film and that of the second insulating film of the F-MOS, resulting in even greater voltage-resistance. Therefore, it is also conceivable to provide three types of capacities differing from one another in insulating film thickness as the booster capacities C1 through C5 in the parallel capacity type charge pumps CP11 and CP12.

By forming and selectively using two types of capacities differing from each other in voltage-resistance, i.e. in insulating film thickness as stated above, capacities having thinner insulating films as illustrated in FIG. 8(b) can be used as the first stage and second stage booster capacities C1 and C2 in the parallel capacity type charge pumps CP11 and CP12 and the capacities Cb0, Cb1 and Cb2 in the booster circuits BST0 through BST2, to none of which a high voltage is applied. This makes it possible to reduce the area occupies by them. On the other hand, whereas a high voltage is applied to the remaining booster capacities C3, C4 and C5 in the parallel capacity type charge pumps CP11 and CP12, the capacities Cb3, Cb4 and Cb5 in the booster circuits BST3 through BST5, and the capacities C11 through C13 and Cb in the serial capacity type charge pumps CP21 and CP22, their voltage-resistance can be assured and their reliability as devices enhanced by using capacities having thicker insulating films as shown in FIG. 8(c).

Figure 9:
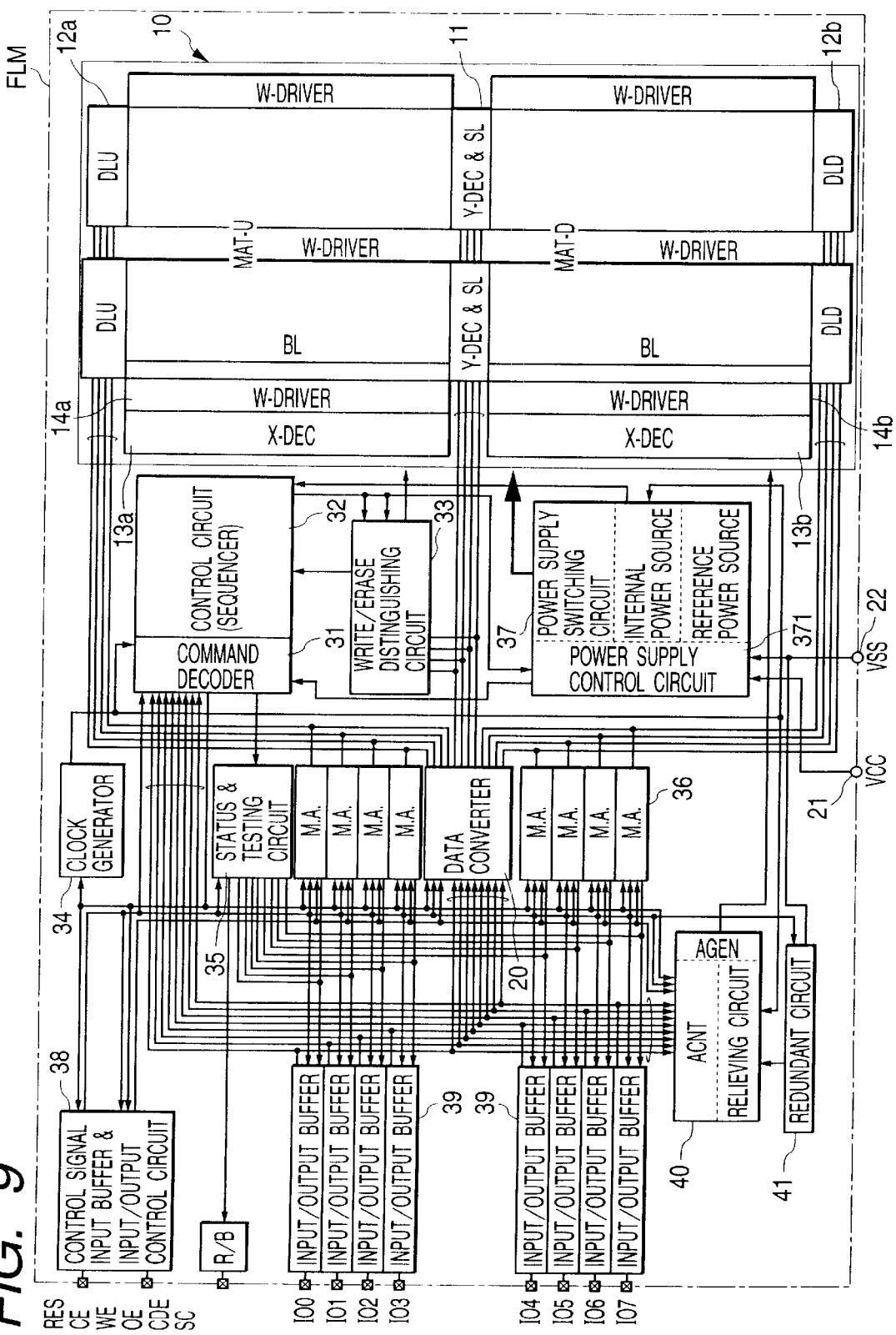
FIG. 9 is an overall block diagram outlining a flash memory provided with a voltage booster circuit, which is a preferred embodiment of the invention.

FIG. 9 is a block diagram of a preferred embodiment of the invention, a flash memory to which a voltage booster circuit according to the invention is effectively applied, as an example of semiconductor integrated circuit. The flash memory FLM of this embodiment is configured as a multi-value memory in which two-bit data can be stored in one memory cell, to be formed over a single semiconductor chip of monocrystalline silicon or the like, though it is not limited to this configuration.

In this embodiment, a memory array is configured of two mats, between which is arranged a sense & latch circuit (hereinafter to be referred to as sense-latch, and denoted by SL in the drawing) connected to a bit line BL in each mat to amplify and latch read signals. Outside the mats, i.e. on the other sides than the sense & latch circuit SL with the bit line BL in-between, latch circuits for temporarily holding write and read data, respectively, are arranged. Hereinafter these latch circuits will be referred to as data latches and denoted by DL in the drawing, and those on the upper mat side and the lower map side will be distinguished from each other by appending U and D, respectively, to the signs.

In FIG. 9, reference numeral 10 denotes the memory array configured of the two memory mats MAT-U and MAT-D; and 20, a data converter for converting every two bits of write data entered from outside into four-value data. In each of the memory mats MAT-U and MAT-D, memory cells each configured of a double gate-structured MOSFET having the floating gate 130 and the control gate 140 shown in FIG. 8(a) are arranged in a matrix form. The control gates of memory cells on the same row are connected to a common word line WL, and the drains of memory cells of the same column are connectable to a common bit line BL.

The memory array 10 is provided with X-line address decoders (word decoders) 13a and 13b and word drive circuits 14a and 14b for driving one word line in each memory mat at a selected level in accordance with the results of decoding by the decoders 13a and 13b, respectively matching the memory mats MAT-U and MAT-D. In the memory array 10 of this embodiment, the word drive circuits are arranged on both sides and between the memory mats, though the configuration is not limited to this arrangement. A Y-line address decoder circuit (Y-DEC) and a column switch (CSW), selectively turned on and off by this decoder to transfer data from the data converter 20 to each matching sense-latch, are integrated with sense-latch arrays (SL)and data latch arrays (DL).

In FIG. 9, these Y-line decoder circuit, column switch and sense-latch circuit are represented by a single functional block 11 (Y-DEC & SL). Data latch arrays 12a and 12b for holding write data converted by the data converter 20 and read data from memory cells are arranged outside the memory mats (above and below them in the drawing).

The flash memory of this embodiment is configured to have a command decoder 31 for decoding commands (instructions) given from an external control unit, and a control circuit (sequencer) 32 for successively forming and supplying a control signal for each circuit within the memory to execute processing matching each command in accordance with the result of decoding by the command decoder 31 and, when a command is given, to execute processing to decipher and automatically respond to it, though not limited to this configuration. The control circuit 32 is provided with a read only memory (ROM) in which, for instance, a series of micro-instruction groups necessary for the execution of commands are stored, and the micro-instructions are successively executed and control signals for circuits within the chip are formed as the command decoder 31 generates the leading address of the micro-instruction group matching each command and giving it to the control circuit 32.

Further in the multi-value flash memory of this embodiment, there are provided, in addition to the circuits referred to above, a write/erase distinguishing circuit 33 for distinguishing, at the time of writing or erasion, the completion of writing or erasion according to data on the sense-latch array SL and informing the control circuit 32 of the completion to end a write sequence or an erase sequence; a clock generator 34 for forming the operating clocks CK1, CK2, CLK1, CLK2 and PCLK2 of the voltage booster circuits 1 and 2 in the above-described embodiment and a plurality of timing clocks necessary for the operation of internal circuits and supplying them to circuits within the memory; a status & testing circuit 35 having functions to form and supply ready/busy signals R/B reflecting the state within the memory and indicating to the outside whether or not it is accessible from outside and t test internal circuits; main amplifier circuits 36 for amplifying signals read out of the memory array 10; a power supply control circuit 37; an input/output control circuit 38 for taking in address signals, write data signals and commands entered from outside, supplying them to prescribed circuits within, and supplying read data signals to outside; input/output buffers 39 for taking in control signals entered from outside and supplying them to the control circuit 32 and other prescribed circuits inside; an address control circuit 40; and a redundant circuit 41 for replacing any faulty bit within the memory array with a reserve memory row.

The power supply control circuit 37 mainly consists of a reference power supply generating circuit for generating a voltage for the write voltage and other voltages to refer to; an internal power supply generating circuit for generating a write voltage, an erase voltage, a read voltage, a verify voltage and other voltages needed within the chip on the basis of a source voltage Vcc; a power supply switching circuit for selecting a desired voltage out of these voltages according to the operating state of the memory and supplying it to the memory array 10; and a power supply control circuit 371 for controlling these circuits. The voltage booster circuits 1 and 2 of the above-described embodiment are provided in the internal power supply generating circuit of this power supply control circuit 37. In FIG. 9, reference numeral 21 denotes a source voltage terminal to which a source voltage Vcc is applied from outside; and 22, another source voltage terminal (ground terminal) to which a ground potential Vss is applied.

Further, the address control circuit 40 mainly consists of an address counter ACNT for taking in address signals entered from outside and counting them up; an address generator AGEN for automatically updating a Y address at the time of data transfer or automatically generating an X address at the time of data erasion; and a relieving circuit for comparing an input address and a faulty address and switching the selected memory row or column when the two addresses are found identical.

Control signals to be entered from an external CPU or the like into the flash memory of this embodiment include, for instance, a resetsignal RES, a chip selection signal CE, a write control signal WE, an output control signal OE, a command enable signal CDE indicating whether the input is a command, data or an address, and a system clock SC.

Next will be described another embodiment of the present invention with reference to FIG. 10.

This embodiment is provided with a frequency divider 51 for dividing the frequency of a clock signal CLK0 for operating a charge pump CP10 which carries out a first stage of voltage boosting and a switching circuit 52 or a selector for switching the clocks CLK1 and CLK2 having undergone frequency division by the frequency divider 51, so that the frequency of the clock signal PCLK to operate the charge pump CP20 for carrying out the second stage of voltage boosting varies in accordance with a control signal from a switching control circuit 53. In the flash memory of the above-described embodiment, the frequency divider 51 can be provided within the clock generator 34, and the switching circuit 52 and the switching control circuit 53, within the power supply control circuit 37.

Also in this embodiment, where voltage boosting by 10 times or more is to be accomplished, it is desirable to use a parallel capacity type unit as the charge pump CP10 for the first stage of voltage boosting and a serial capacity type unit as the charge pump CP20 for the second stage of voltage boosting.

The applicable configuration, however, is not limited to this. The embodiment can be applied, in particular, where the load on the charge pump CP10 10 for the first stage of voltage boosting is a resistive load and that on the charge pump CP20 10 for the second stage of voltage boosting is a capacitive load, and the charge pump CP10 for the first stage of voltage boosting is of a serial capacity type and the charge pump CP20 for the second stage of voltage boosting is of a parallel capacity type, or where both are serial capacity type units or both are parallel capacity type units.

By applying this embodiment, it is made possible to effect control so as to lower the frequency of the clock signal to operate the charge pump CP20 for the second stage of voltage boosting when, for instance, the level of the source voltage Vcc supplied from outside drops or power consumption by the charge pump CP10 for the first stage of voltage boosting increases. This makes possible assurance of proper operation of both the circuits operating on the boosted voltage from the charge pump for the first stage of voltage boosting and those operating on the boosted voltage from the charge pump for the second stage of voltage boosting.

For instance in the flash memory of the above-described embodiment, while running on the boosted voltage of the second stage are circuits for write and erasion and, only if the voltage level is assured for them, no fatal trouble can occur even if some time is taken to reach a desired level, the undesirable eventuality that chips are prevented from operating by the failure of the boosted voltage to attain the target level can be averted, because the boosted voltage can reach the desired level even if it has to be awaited for some time. Furthermore, in this way of embodying the invention, a product (flash memory) whose source voltage Vcc is compatible with both 3 V-based systems and 1.8 V-based systems can be provided.

Figure 10:
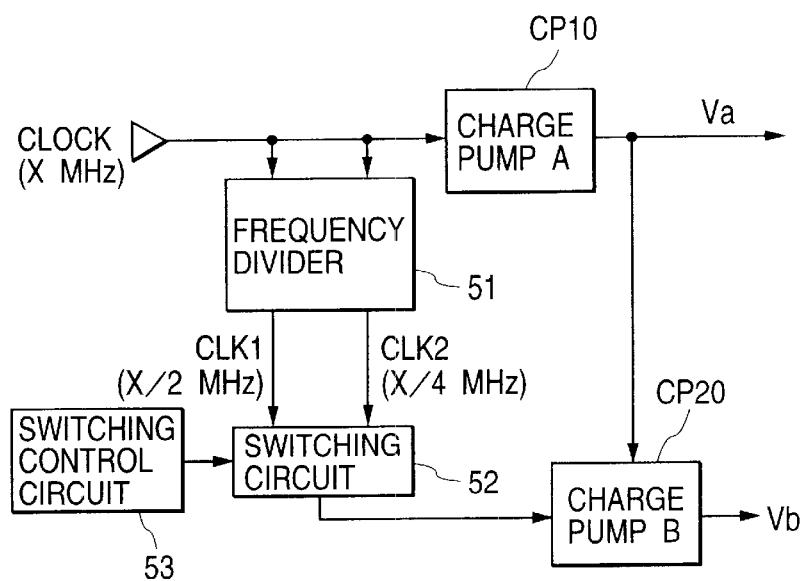
FIG. 10 is a block diagram of a voltage booster circuit, which is another preferred embodiment of the invention.
Figure 11:
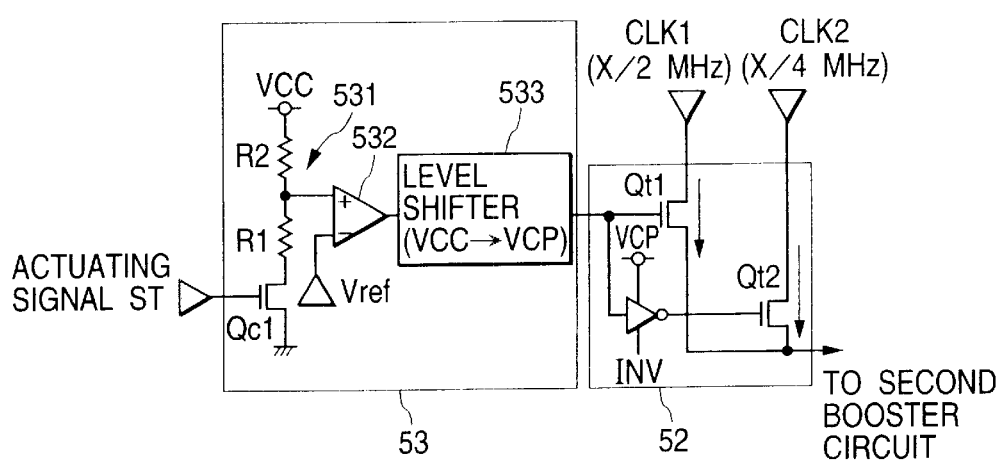
FIG. 11 is a circuit configuration diagram illustrating a specific example of switching control circuit in FIG. 10.

FIG. 11 is a circuit configuration diagram illustrating a more specific example of configuration of the switching circuit 52 and the switching control circuit 53 in FIG. 10.

The switching circuit 52 is configured of MOSFETs Qt1 and Qt2 provided on the respective transmission paths of two clocks CLK1 and CLK2 supplied from the frequency divider 51 and an inverter INV for inverting the gate control signal of Qt1 and supplying the inverted signal to the gate terminal of Qt2. The switching control circuit 53 is configured of a resistance dividing circuit 531, comprising two resistors R1 and R2 connected in series between the source voltage Vcc and the ground potential and of a MOSFET Qc1, for generating voltages resulting from the division of the source voltage Vcc by the resistance ratio between the resistors R1 and R2; a comparator 532 for comparing the voltages generated by the resistance dividing circuit 531 with a reference voltage Vref of a preset prescribed level; and a level shift circuit 533 for expanding the amplitude of the output signal of the comparator 532 from Vcc to VCP.

Figure 12A:
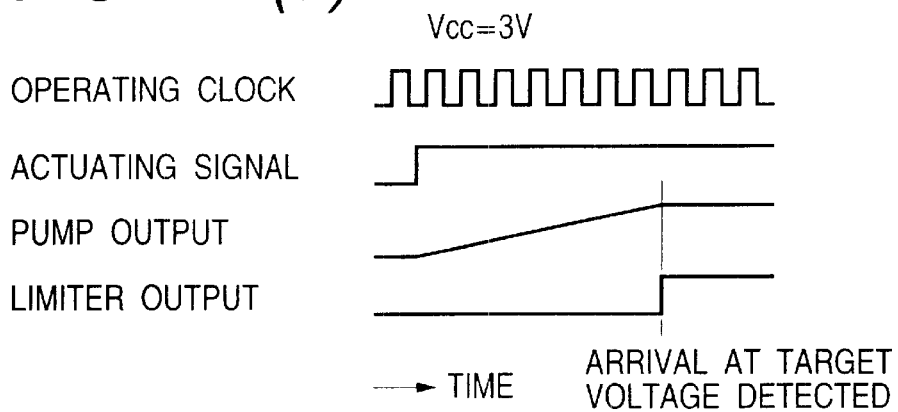
FIGS. 12a, 12b & 12c is a timing chart showing the operating timing of the circuit of FIG. 11.
Figure 12B:
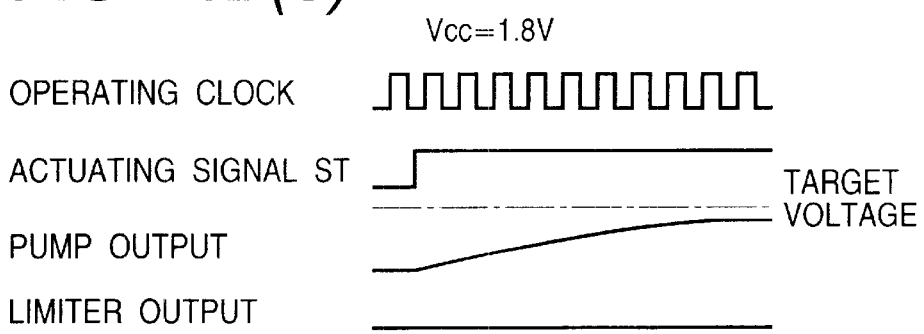
Figure 12C:
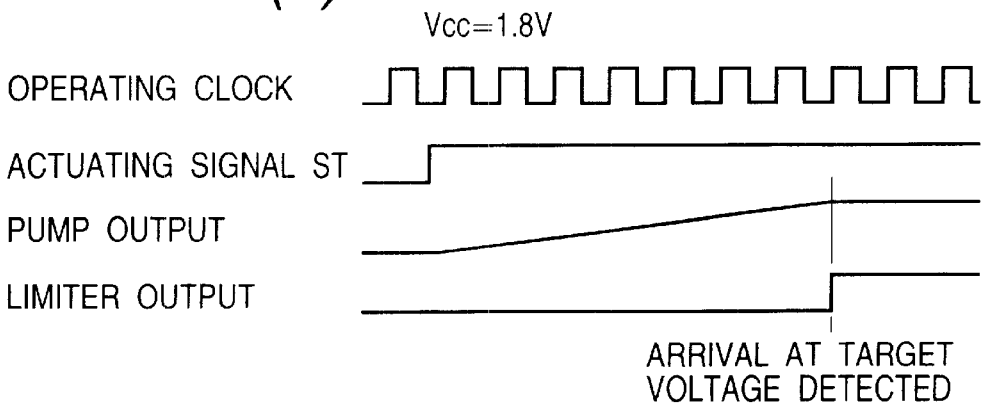

The MOSFET Qc1 in the resistance dividing circuit 531 is a switch to make it possible to let a current flow to the resistors R1 and R2 or to intercept the flow under control with a start signal ST so as to activate this switching control circuit 53 only when the charge pump CP20 for the second stage of voltage boosting is operating (when writing into or erasing any content from the flash memory). Incidentally, as this start signal ST, a signal of the logical sum of the control signals ST2 and ST3 in the embodiment shown in FIG. 1 can be used. The application of this arrangement results in the failure of the output of the charge pump CP20 for the second stage of voltage boosting, which reached the target voltage where the external source voltage Vcc was 3 V-based even if the clock frequency was high as shown in FIG. 12(a), to reach the target voltage where the external source voltage Vcc is 1.8 V-based if the clock frequency is high as shown in FIG. 12(b). However, by lowering the clock frequency as shown in FIG. 12(c), the output of the charge pump CP20 for the second stage of voltage boosting can eventually attain the target voltage even though it takes a longer time.

Figure 13:
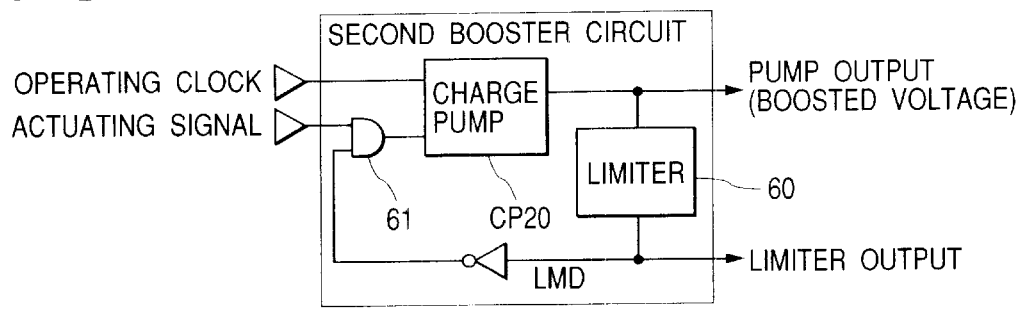
FIG. 13 is a block diagram of a voltage booster circuit, which is another preferred embodiment of the invention.

The limiter output in FIG. 12 means a signal LMD supplied from a limiter circuit 60 which is provided on the output side of the charge pump CP20 and, as shown in FIG. 13, prevents the boosted voltage from surpassing a desired level. The limiter circuit 60 in this embodiment is configured so as to supply a high level detection signal LMD when the output voltage of the voltage booster circuit has reached a desired level. As many proposals have already made regarding such a limiter circuit and level detection circuit, description of any specific circuit is dispensed with here.

In the embodiment shown in FIG. 13, there is provided an AND gate 61 the control signal for which is the output signal LMD of this limiter circuit 60. The start signal ST for the charge pump CP20 is controlled with the limiter output LMD, and when the output boosted voltage of the charge pump CP20 has surpassed a desired level, the operation of the charge pump CP20 can be stopped to reduce wasteful power consumption.

Further, the flash memory shown in FIG. 9 can be so configured as to supply the limiter output LMD to the control circuit 32 to let the control circuit 32, in response to the variation of this limiter output LMD to a high level, start applying a write or erase voltage to the memory cells. This makes possible combined use of the circuit shown in FIG. 13 and that shown in FIG. 11 to provide the flash memory with the combination so that, no matter whether the external source voltage Vcc of the system is 3 V-based or 1.8 V-based, accurate writing and erasion can be executed in exactly the same sequence even though the length of time required differs, resulting in expanded versatility of the chip.

Figure 14:
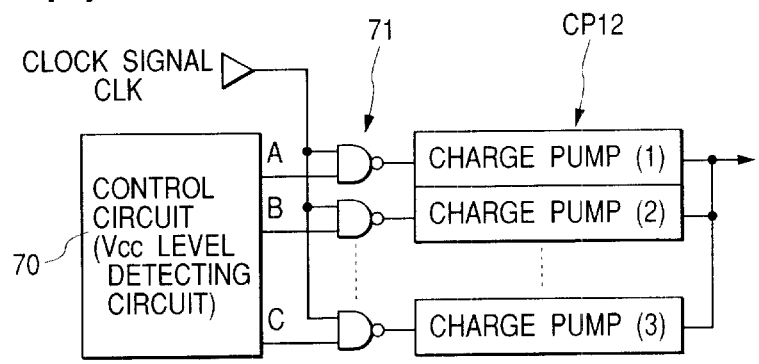
FIG. 14 is a block diagram of a voltage booster circuit, which is another preferred embodiment of the invention.

FIG. 14 illustrates still another embodiment. In this embodiment, for instance the counterpart of the charge pump CP12 for supplying a boosted voltage to resistive load circuits in the first stage voltage booster circuit 1 shown in FIG. 1, is configured of a plurality of (n) parallel charge pumps. A control circuit 70 having a circuit like the circuit 531 for detecting the level of the source voltage Vcc, shown in FIG. 11, and gate circuits 71 matching different charge pumps are provided, and the gate circuits 71 are controlled with a signal, supplied from the control circuit 70, matching the level of the source voltage. When the source voltage Vcc is low, the operating clock CLK is supplied to all the charge pumps to cause them to carry out voltage boosting, or when the source voltage Vcc is high, the gate circuit 71 is so controlled as to the reduce the number of charge pumps to which the operating clock CLK is supplied. This arrangement can stabilize the supply capacity of the voltage booster circuit irrespective of the level of the source voltage.

If it is supposed that each of the parallel charge pumps in this embodiment has the same configuration as a separate charge pump, and that and the whole plurality has the same supply capacity as a single charge pump, each of the pumps is set to 1/n of the capacitance of the booster capacity within the charge pump where the capacitance of the internal booster capacity is considered collectively. The control circuit 70 is provided in the power supply control circuit 371, the control circuit 32 or the like in the flash memory shown in FIG. 9.

In this embodiment, too, the embodiment shown in FIG. 13 can be applied to supply the limiting output of the limiter circuit, provided on the output side of charge pumps, to the control circuit 70 to control the charge pumps according to the boosted voltage so as to reduce power consumption. Furthermore, the applicability of this embodiment is not limited to the charge pump CP12, in the voltage booster circuit 1 of the first stage shown in FIG. 1, for supplying a boosted voltage to resistive load circuits, but can also be applied to the charge pump CP11 for supplying a boosted voltage to capacitive load circuits and to the charge pumps CP21 and CP22 in the voltage booster circuit 2 of the second stage.

Figure 15:
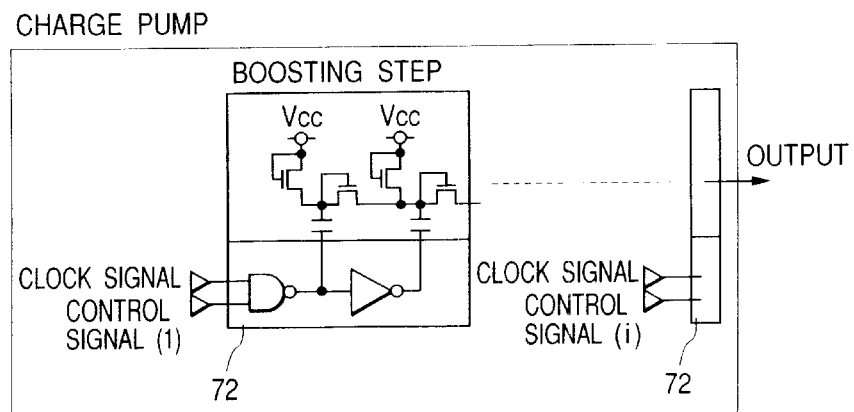
FIG. 15 is a block diagram of a voltage booster circuit, which is another preferred embodiment of the invention.

Methods of controlling the boosted voltage supply capacity according to the level of the source voltage conceivably include, beside s the embodiment shown in FIG. 14 where the number of operating charge pumps made variable, making the number of voltage boosting steps of the charge pump variable. More specifically, this can be realized by providing, as shown in FIG. 15, a gate circuit 72 for clock control at each voltage boosting state of the charge pumps, and regulating the control gate circuit 72 with control signals (1), (2) ... (i) from a circuit like the control circuit 70 in FIG. 14 to make possible interception of the supply of the operating clock at each stage of voltage boosting.

Although the inventions accomplished by the present inventors have been hitherto described in specific terms with reference to preferred embodiments there, the invention is not limit to these embodiments, but needless to mention the embodiments can be modified in many different ways without deviating from the true spirit and scope of the invention. For instance, in these embodiments, the voltage is boosted by the charge pumps of the first stage voltage booster circuit by almost sixfold of the source voltage and the boosted voltage is limited to about 7 V by the limiter circuit provided on the output side and, at the same time, the charge pumps of the second stage voltage booster circuit, using the boosted voltage from the first stage voltage booster circuit, boosts it by almost three times and limits the boosted voltage to about 16 V by the limiter circuit provided on the output side. Thus in these embodiments, the ultimate boosted voltages are supposed to be 16 V and −16 V required by the flash memory which performs writing and erasion by tunnel injection (about nine times as high as the 1.8 V source voltage), but it is quite possible to obtain a boosted voltage 10 times or more higher than the source voltage by properly adjusting the limit voltage with the limiter circuit.

Also, the number of stages of the charge pumps of the first stage voltage booster circuit and those of the charge pumps of the second stage voltage booster circuit need not be limited to the combination of five and three stages, respectively, in these embodiments, but other combination, such as four and three or four stages, or six and three or two stages, can also be used.

Although the foregoing description mainly focused the application of the invention accomplished by the present inventors to the flash memory, which is a field of application underlying the inventive attempt, the invention is not limited to this application, but can be extensively utilized in semiconductor integrated circuits needing and generating inside a plurality of boosted voltages. The invention can be effectively applied to nonvolatile semiconductor memories which perform writing into and erasing any content out of nonvolatile memory elements each having a floating gate by utilizing the FN tunnel phenomenon, and can be particularly effective when applied to multi-value memories storing a plurality of bits of information per element.

Advantages provided by some of the most typical aspects of the invention disclosed by the present application can be summarized as follows.

Thus, according to the invention, a voltage booster circuit can be obtained which can generate a boosted voltage 10 times or more as high as the source voltage that is supplied. Also, according to the invention, there is provided a voltage booster circuit capable of efficiently generate a boosted voltage by selectively using the charge pumps according to the type of circuit to which the boosted voltage is to be supplied.

Further according to the invention, power consumption can be changed by selectively operating charge pumps according to the mode of operation. Also, the invention provides a voltage booster circuit capable of generating a stable boosted voltage irrespective of the levels of the source voltage and of power consumption.

We claim:

1. A semiconductor integrated circuit comprising a voltage booster circuit for generating a boosted voltage on the basis of a source voltage supplied from outside, wherein:

said voltage booster circuit comprises: a first voltage booster circuit, including parallel capacity type charge pumps, for carrying out a first stage of voltage boosting on the basis of the source voltage; and a second voltage booster circuit, including serial capacity type charge pumps, for carrying out a second stage of voltage boosting on the basis of the boosted voltage generated by said first voltage booster circuit.

2. A semiconductor integrated circuit according to claim 1, wherein said first voltage booster circuit comprises: a first parallel capacity type charge pump in which a circuit on a side to which the generated voltage is supplied is capacitive loads; and a second parallel capacity type charge pump in which a circuit on a side to which the generated voltage is supplied is resistive loads, and said second voltage booster circuit carries out second stage voltage boosting on the basis of the boosted voltage generated by said first parallel capacity type charge pump.

3. A semiconductor integrated circuit according to claim 2, wherein said second voltage booster circuit is provided with a first serial capacity type charge pump for generating a positive boosted voltage and a second serial capacity type charge pump for generating a negative boosted voltage.

4. A semiconductor integrated circuit according to claim 3, wherein the number of voltage boosting stages of said first and second parallel capacity type charge pumps is greater than the number of voltage boosting stages of said first and second serial capacity type charge pumps.

5. A semiconductor integrated circuit according to claim 4, wherein, in said first parallel capacity type charge pumps, their voltage boosting operation can be stopped in accordance with a first control signal.

6. A semiconductor integrated circuit according to claim 5, wherein, in said first serial capacity type charge pumps or second serial capacity type charge pumps, their voltage boosting operation can be stopped in accordance with a second control signal.

7. A semiconductor integrated circuit according to claim 6, wherein at least said second parallel capacity type charge pumps are comprised of a plurality of parallel capacity type charge pumps connected to one another in parallel, and are so configured that the number of operating charge pumps is determined according to the level of the source voltage.

8. A semiconductor integrated circuit according to claim 7, wherein said first parallel capacity type charge pumps and second parallel capacity type charge pumps are operated by a plurality of operating clock signals, and said first voltage booster circuit is provided with an auxiliary voltage booster circuit for generating a boosted voltage lower than the boosted voltage generated by that first voltage booster circuit on the basis of the source voltage, and at least some of said plurality of operating clock signals are expanded in amplitude on the basis of the boosted voltage generated by said auxiliary voltage booster circuit.

9. A semiconductor integrated circuit according to claim 8, wherein said first serial capacity type charge pumps and second serial capacity type charge pumps are operated by a plurality of second operating clock signals, and said second voltage booster circuit is provided with a second auxiliary voltage booster circuit for generating, on the basis of the boosted voltage generated by said first voltage booster circuit, a boosted voltage lower than the boosted voltage generated by that second voltage booster circuit, and at least some of said plurality of second operating clock signals are expanded in amplitude on the basis of the boosted voltage generated by said second auxiliary voltage booster circuit.

10. A semiconductor integrated circuit provided with a voltage booster circuit for generating a boosted voltage on the basis of a source voltage supplied from outside, wherein:

said voltage booster circuit comprises: a first voltage booster circuit, including parallel capacity type charge pumps, for carrying out a first stage of voltage boosting on the basis of the source voltage; and a second voltage booster circuit, including serial capacity type charge pumps, for carrying out a second stage of voltage boosting on the basis of the boosted voltage generated by said first voltage booster circuit;

booster capacities in said parallel capacity type charge pumps are:

capacities having, on the surface of a well region of the same first conductivity type as the well region of a second conductivity type over which MOSFETs of a first conductivity type are formed, MOSFETs of the second conductivity type and a contact region comprised of a semiconductor region of the same conductivity type as source and drain regions, and a conductive layer formed over the well region of said same conductivity type via an insulating film, wherein the well region of said same conductivity type is made a first electrode, said conductive layer is made a second electrode and said insulating film is made a dielectric, and the insulating film of the first stage side booster capacity, out of the booster capacities of different stages of said parallel capacity type charge pumps, is thinner than the insulating film of the final stage side booster capacity.

11. A semiconductor integrated circuit according to claim 10, including a nonvolatile memory element having a floating gate electrode and a control gate electrode, wherein a threshold voltage varies according to injection or withdrawal of an electric charge into or from said floating gate electrode, and storing information according to that threshold voltage, and said insulating film of said first stage side booster capacity has the same thickness as the insulating film underneath the floating gate electrode of said nonvolatile memory element.

12. A nonvolatile memory having a floating gate electrode and a control gate electrode, wherein a threshold voltage varies according to injection or withdrawal of an electric charge into or from said floating gate electrode, and provided with a nonvolatile memory element for storing information according to that threshold voltage and with voltage booster circuits for generating a boosted voltage on the basis of a source voltage supplied from outside, wherein:

said voltage booster circuits comprise a first voltage booster circuit, including parallel capacity type charge pumps, for carrying out first stage voltage boosting on the basis of the source voltage, and a second voltage booster circuit, including serial capacity type charge pumps, for carrying out second stage voltage boosting on the basis of the boosted voltage generated by said first voltage booster circuit;, said second voltage booster circuit generates:
a first boosted voltage for injecting electric charges into the floating gate electrode of said nonvolatile memory element by utilizing the FN tunnel phenomenon, and
a second boosted voltage for withdrawing electric charges from said floating gate electrode by utilizing the FN tunnel phenomenon.

13. A nonvolatile memory according to claim 12, wherein said first voltage booster circuit comprises: a first parallel capacity type charge pump in which a circuit on a side to which the generated voltage is supplied is capacitive loads; and a second parallel capacity type charge pump in which a circuit on a side to which the generated voltage is supplied is resistive loads, and said second voltage booster circuit carries out second stage voltage boosting on the basis of the boosted voltage generated by said first parallel capacity type charge pump.

14. A nonvolatile memory according to claim 13, wherein said second voltage booster circuit comprises: a first serial capacity type charge pump for generating a positive boosted voltage for use in injecting electric charges into the floating gate electrode; and a second serial capacity type charge pump for generating a negative boosted voltage for use in withdrawing electric charges from the floating gate electrode.

15. A nonvolatile memory according to claim 14, wherein said first parallel capacity type charge pump is configured so as to stop its voltage boosting operation, in writing or erasing data into or out of said nonvolatile memory element, on the basis of a first control signal.

16. A nonvolatile memory according to claim 15, wherein, in said first serial capacity type charge pump, its voltage boosting operation is stopped when data are erased from said nonvolatile memory element on the basis of a second control signal, and in said second serial capacity type charge pump, its voltage boosting operation is stopped when data are written into said nonvolatile memory element on the basis of said second control signal.

17. A nonvolatile memory device comprising:
a logic circuit including a decoder circuit;
a memory array having a plurality of word lines; and
a booster circuit including a first boost unit and a second boost unit,
wherein said first boost unit has a parallel capacity type charge pump and supplies a first voltage boosted from a source voltage to said logic circuit, and
wherein said second boost unit has a serial capacity type charge pump and supplies a second voltage boosted from said first voltage to said word line corresponding to an output of said decoder circuit.

18. a nonvolatile memory device according to claim 17, wherein said second boost unit supplies said second voltage for programming data to a nonvolatile memory cell or for erasing data stored in said nonvolatile memory cell.

19. A nonvolatile memory device according to claim 18, wherein said second boost unit stops boosting during reading of data from said nonvolatile memory cell.

20. A nonvolatile memory device according to claim 19, wherein said second boost unit has a first charge pump and a second charge pump,
wherein said first charge pump is a serial capacity type charge pump and generates a positive voltage for said programming data, and
wherein said second charge pump is a serial capacity type charge pump and generates a negative voltage for said erasing data.

21. A nonvolatile memory device according to claim 20, wherein said first charge pump stops boosting during erasing of data stored in said nonvolatile memory cell, and
wherein said second charge pump stops boosting during programming of data to said nonvolatile memory cell.

22. A nonvolatile memory device according to claim 21, wherein said first boost unit has a third charge pump and a fourth charge pump,
wherein said third charge pump is said parallel capacity type charge pump and supplies said first voltage to said logic circuit, and
wherein said fourth charge pump is said parallel capacity type charge pump and supplies boosted voltage to said second boost unit.

23. A nonvolatile memory device according to claim 22, wherein said fourth charge pump stops boosting during reading of data from said nonvolatile memory cell.

* * * * *